United States Patent [19]

Kono et al.

[11] Patent Number: 5,866,468
[45] Date of Patent: Feb. 2, 1999

[54] METHOD FOR FABRICATING AN SOI SUBSTRATE

[75] Inventors: Mitsuo Kono, Hadano; Kei Matsumoto, Hiratsuka, both of Japan

[73] Assignee: Komatsu Electronic Metal Co., Ltd., Kanagawa, Japan

[21] Appl. No.: 696,719

[22] Filed: Aug. 14, 1996

[51] Int. Cl.$^6$ .................................................. H01L 21/76
[52] U.S. Cl. ........................... 435/458; 438/406; 438/517
[58] Field of Search ................................ 438/4, 295, 406, 438/517, 919, 222, 155, 434, 444, 455

[56] References Cited

U.S. PATENT DOCUMENTS

| | | |
|---|---|---|
| 4,263,057 | 4/1981 | Ipri . |
| 4,851,366 | 7/1989 | Blanchard . |
| 5,308,776 | 5/1994 | Gotou . |
| 5,686,364 | 11/1997 | Ohki et al. . |

Primary Examiner—George R. Fourson
Attorney, Agent, or Firm—Welsh & Katz, Ltd.

[57] ABSTRACT

In the wafer-bonding method of fabricating an SOI (silicon-on-insulator) substrate, even if there exists thickness variation in the silicon layer, devices fabricated onto the silicon layer, in accordance with the present invention, have a decreased threshold voltage variation. According to the present invention, after bonding two wafers, the thickness of the thinned silicon layer atop the SOI substrate is measured to precisely determine the local thickness distribution. However, the fabricated devices' threshold voltage depends upon the doping concentration as well as the thickness of the silicon layer. Shielding masks of photoresist are thereafter formed selectively on a portion of the silicon that are thicker. Then, through the masks as shielding, impurities are implanted into the silicon layer to adjust the doping concentration therein. Accordingly, the doping concentration is varied corresponding to the thickness, with the result that the threshold voltage variation nearly approaches zero.

6 Claims, 2 Drawing Sheets

METHOD FOR FABRICATING AN SOI SUBSTRATE

BACKGROUND OF THE INVENTION

1. Field of the Invention

The present invention generally relates to an SOI substrate and its fabrication method suitable for forming a silicon layer, having a thickness of about 1000 Å, atop the SOI substrate, on which a completely depletion-mode device can be fabricated.

2. Description of the Related Art

As compared with the method for fabricating integrated circuits on a bulk semiconductor substrate, the method of fabricating integrated circuits on a thin semiconductor layer which is deposited on an insulating layer has several advantages, such as superior device characteristics, and complete isolation between the devices. From this point of view, a structure called silicon-on-insulator (SOI) is, for example, configured with a single crystalline silicon layer formed on an insulating layer of $SiO_2$, which overlies a single crystalline silicon substrate. By a silicon-wafer bonding method, the silicon layer provided with high-crystallization and any thickness at will can be achievable.

However, with respect to the SOI substrates formed by the wafer-bonding method, a key issue problem is how to form a silicon layer of uniform thickness by combining polishing with etching. A silicon layer having a thickness of about 0.1 $\mu$m is used to fabricate completely depletion-mode metal-oxide-semiconductor field-effect transistors (MOSFET) thereon. Clearly, to decrease the threshold voltage $V_{th}$ variation among such MOSFET devices, it is important to precisely control the thickness of the silicon layer. Conventionally, plasma etching process has been utilized to control the uniformity of the silicon layer to a thickness of about 1000 Å with a precision of ±50 Å. However, if a decrease in the variation distribution of the threshold voltage $V_{th}$ in surfaces of the fabricated devices is required, it is necessary to further improve the planarization of the silicon layer. Therefore, the amount of time consumed and manufacturing cost of processing the silicon layer are greatly increased.

SUMMARY OF THE INVENTION

It is therefore an object of the present invention to resolve the aforementioned issues with which the prior arts are faced by providing an SOI substrate and its fabrication method. Even if the silicon layer formed atop the SOI substrate appears to be of non-uniform thickness, devices fabricated thereon have decreased threshold voltage variation in a surface of the substrate in particular.

For achieving above-identified object, the present invention provides a method for fabricating SOI substrate by bonding two semiconductor wafers via an insulating layer, wherein the doping concentration distribution of the silicon layer is locally varied corresponding to the thickness distribution.

Moreover, the silicon layer, according to the present invention, overlying the SOI substrate kept the threshold voltage of fabricated devices nearly constant by the fact that doping concentration of the silicon layer is locally varied corresponding to its thickness.

Accordingly, the threshold voltage of complete depletion-mode devices, such as SOI MOSFETs, fabricated on the SOI substrate depends on the doping concentration of the channel as well as the thickness of the silicon layer. Therefore, if the doping concentration of the channel is uniform, the threshold voltage reveals distribution variation corresponding to thickness distribution. In such a structure, according to the present invention, the doping concentration distribution corresponds to the thickness distribution locally, resulting in decreased threshold voltage variation even if there is distribution variation in thickness.

BRIEF DESCRIPTION OF THE DRAWINGS

Other objects, features and advantages of the present invention will become apparent by way of the following detailed description of the preferred but non-limiting embodiment. The description is made with reference to the accompanying drawings, wherein.

DESCRIPTION OF THE PREFERRED EMBODIMENTS

Figure 1A:
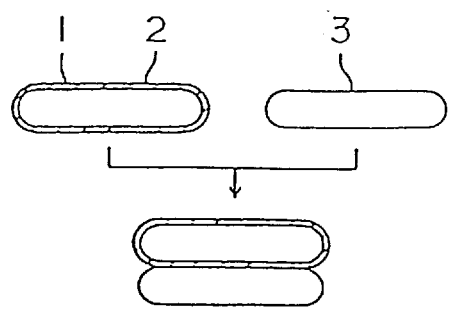
FIGS. 1a–1e depict the process flow diagrams of fabricating an SOI substrate in accordance with the first preferred embodiment of the present invention in cross-sectional view.

Referring to FIGS. 1a–1e, the process flow diagram of an SOI substrate in accordance with the first embodiment of the present invention is depicted in cross-sectional view, wherein FIGS. 1b–1e are the partially expanded sectional views of the SOI substrate. As shown in FIG. 1a, oxidation to the surface of a wafer 1 forms an oxide layer 2 having a predetermined thickness. Then, the wafer 1 with the grown oxide layer 2 is bonded with another wafer 3 via the oxide layer 2 at room temperature. Those bonded wafers are thereafter subjected to thermal treatment to assure the bonding strength.

Figure 1B:
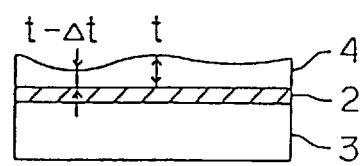

Then, as depicted in FIG. 1b, the surface of the wafer 1 is subjected to the sequential steps of polishing, plasma etching, and so on, to form and thin a silicon layer 4 to a predetermined thickness. As mentioned above, the thickness of the thinned silicon layer 4 reveals local distribution variation. After measuring the thickness by an ellipsometer, NANOSUPEKU (trademark name), t designates the maximum value of the measured thickness of the silicon layer 4; t–Δt represents the measured thickness of the maximum value t subtracted from its variation Δt. The doping concentration of the portion having thickness t designates $N_D$.

Figure 1C:
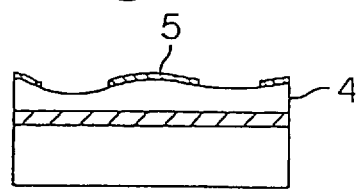
Figure 1D:
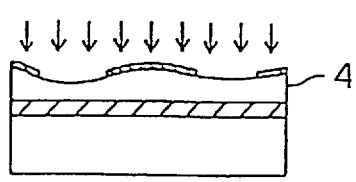
Figure 1E:
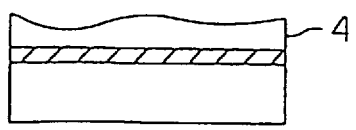

Next referring to FIG. 1c, shield masks 5 formed of photoresist overlie portions of the silicon layer 4 that are thicker. Subsequently, as depicted in FIG. 1d, impurities are implanted into the silicon layer 4, through the shielding of masks 5, performed by an ion-implantor. Meanwhile, the implanted ions have the conductivity type same as that of the silicon layer 4. For example, if the silicon layer 4 is P-type, the implanted ions are acceptor impurities; if the silicon layer N-type, the implanted ions are donor impurities. The doping concentration of the implanted ions, relative to the portions of the silicon layer 4 having a thickness difference –Δt, appears as an increased doping concentration $\Delta N_D$ therein. Accordingly, the doping concentration is $N_D+\Delta N_D$ while the thickness of the silicon layer 4 is t–Δt. The method for figuring the aforementioned $N_D+\Delta N_D$ will be depicted in the following. The masks 5 are thereafter removed as shown in FIG. 1e. If required, damage recovery is done.

The relation among the maximum thickness t of the silicon layer 4, the doping concentration $N_D$ of the channel, and the silicon layer t–Δt associated with the doping concentration $N_D+\Delta N_D$ is described below. When the gate voltage $V_g$ is applied at the threshold voltage $V_{th}$, the potential energy of the silicon layer operated in completely depletion-mode is $\Phi_{th,t}$, the charge density per unit volume is ρ, the dielectric constant of silicon is $\epsilon_{Si}$, and the relative dielectric constant in vacuum is $\epsilon_o$. The Poisson equations for the potential energy are given by $$\frac{d^2\Phi}{dx^2} = -\frac{\rho}{\epsilon_{Si}\epsilon_o} \quad (1)$$

$$\frac{d}{dx}\left|\frac{d\Phi}{dx}\right| = -\frac{\rho}{\epsilon_{Si}\epsilon_o}$$

Because $\rho=qN_D$ (q designates the electron charge and is kept constant), $$\frac{d\Phi}{dx} = -\frac{qN_D x}{\epsilon_{Si}\epsilon_o} + const. \quad (2)$$

$$\int_{\Phi_{th,t}}^{0} d\Phi = (qN_D/\epsilon_{Si}\epsilon_o)\int_0^t x\,dx$$

$$\Phi_{th,t} = (q/2\epsilon_{Si}\epsilon_o)N_D t^2$$

For the same reason, $\Phi_{th,t-\Delta t}$, t–Δt, and $N_D+\Delta N_D$ have a relationship given by $$\Phi_{th,t-\Delta t}=(q/2\epsilon_{Si}\epsilon_o)(N_D+\Delta N_D)(t-\Delta t)^2 \quad (3)$$

For $\Phi_{th,t}=\Phi_{th,t-\Delta t}$ given by equations (2) and (3), $$N_D+\Delta N_D=N_D\{t/(t-\Delta t)^2\} \quad (4)$$

An implanting dosage that satisfies equation (4) is applied to the silicon layer 4 during implanting. However, the solved $N_D$ according to equation (4) is merely an approximate value, and depends on device design including operating condition and process condition for fabrication device on SOI substrate. Hence, the solved doping concentration must operate in coordination practical conditions, and is somewhat adjusted for optimum.

In the first preferred embodiment, the doping concentration contained in the silicon layer is adjusted to overcome the problems arising from the thickness variation of the silicon layer that the conventional method encounters. Accordingly, the variation of the threshold voltage nearly approaches zero.

Figure 2A:
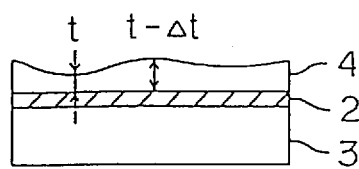
FIGS. 2a–2c depict the process flow diagrams of fabricating an SOI substrate in accordance with the second preferred embodiment of the present invention in cross-sectional view.

As depicted in FIG. 2, the process flow diagrams of an SOI substrate in accordance with the second embodiment of the present invention is depicted in cross-sectional view. After the bonded wafers are subjected to polishing and plasma etching to the predetermined thickness, similar to the first preferred embodiment, the thickness of the silicon layer is measured by predetermined spacing. In FIG. 2a, t designates the minimum value of the measured thickness of the silicon layer 4; t+Δt represents the measured thickness of the minimum value t added by its variation Δt. The doping concentration of the portion having thickness t designates $N_D$.

Figure 2B:
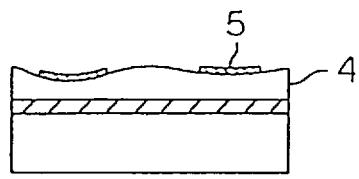
Figure 2C:
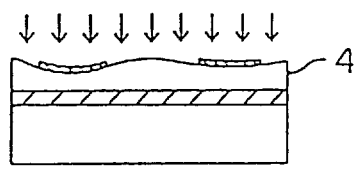

As depicted in FIG. 2b, after clearly determining the thickness distribution of the silicon layer 4, shielding masks 5 formed of photoresist overlie portions of the silicon layer 4 that are thinner locally. Subsequently, as shown in FIG. 2c, impurities are implanted, through the masks 5 as shielding, into the silicon layer 4 by an ion implantor. Meanwhile, the portion of the silicon layer 4 with a thickness of t+Δt is provided with effective doping concentration ($|N_{donor}-N_{acceptor}|$) of a decreased difference of $\Delta N_D$. The conductivity type of implanted impurities is opposite to that of the silicon layer 4. For instance, if the silicon layer 4 is P-type, the implanted impurities are donor ions; if the silicon layer 4 is N-type, the implanted impurities are acceptor ions. Then the masks are removed. If required, the SOI substrate is thereafter subjected to damage recovery treatment.

Moreover, after precisely controlling the thickness distribution of the silicon layer 4, the average thickness can be utilized as a criterion designated as t so as to vary the doping concentration based thereupon. At that time, the portion of the silicon layer 4 having smaller thickness than the average thickness t is doped with impurities of the same conductivity type as that of the silicon layer 4, and, furthermore, the portion of the silicon layer 4 having larger thickness than the average thickness t is doped with impurities of opposite conductivity type to that of the silicon layer 4.

Figure 3:
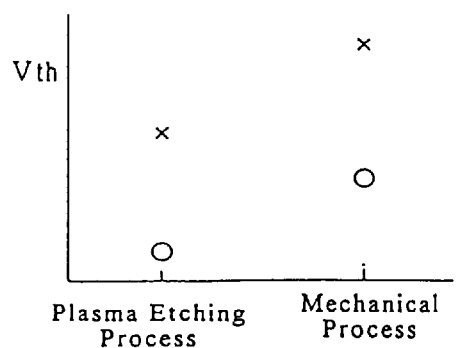
FIG. 3 depicts the threshold voltage distribution diagram of the fabricated SOI substrate.

FIG. 3 depicts the threshold voltage distribution diagram of the SOI substrate fabricated in accordance with the present invention, wherein cross-shaped symbols represent the measured results according to the conventional method, and circle symbols designate the measured results based upon the present invention. Depending on the thickness difference Δt, the associated doping concentration $N_D$ is adjusted to vary $\Delta N_D$. As compared with either mechanical process or plasma etching process, the silicon layer 4 atop the SOI substrate appears a decreased threshold voltage variation. Similarly, the SOI substrate fabricated in accordance with the second preferred embodiment demonstrates the same results.

The threshold voltage of completely depletion-mode devices fabricated on the SOI substrate associates with the thickness of the silicon layer as well as the doping concentration of the channel region. Therefore, in accordance with the present invention, the local doping concentration is varied, depending upon the thickness difference of the silicon layer 4. Accordingly, the method for fabricating SOI substrate according to the present invention has the following effects:

(1) The threshold voltage of the fabricated completely depletion-mode devices has decreased variation, nearly approaching to zero. Therefore, high-quality SOI substrates can be acquired.

(2) Even though the polished silicon layer reveals inferior thickness variation, for example, about ±20%, the threshold voltage of the devices fabricated on the SOI substrate demonstrates decreased variation, thus reducing the manufacturing cost when using high-price plasma etching for planarization.

Alternative embodiments of the invention have now been described in detail. It is to be noted, however, that this description of these embodiments is also illustrative of the principles underlying the inventive concept. It is therefore contemplated that various modifications of the disclosed embodiments will, without departing from the spirit and scope of the invention, be apparent to persons of ordinary skill in the art, and the scope of the invention is intended to be limited only by the appended claims.

What is claimed is:

1. A method of fabricating an SOI substrate, comprising the steps of:

bonding at least two semiconductor wafers each other to form the SOI substrate having a silicon layer thereatop said silicon layer having a surface; and adjusting a dopant concentration to the silicon layer locally corresponding to a thickness of the silicon layer so that threshold voltage of the silicon layer is uniform over the entire surface independent of the thickness variation of the silicon layer.

2. The method of fabricating an SOI substrate as claimed in claim 1, wherein the step of adjusting a dopant concentration further comprises the steps of:

measuring a thickness of the silicon layer; and applying a dopant selectively corresponding to the measured thickness of the silicon layer.

3. The method of fabricating an SOI substrate as claimed in claim 1, wherein the step of applying a dopant comprises the steps of:

covering a measured thinner region of the silicon layer than a predetermined value by a photoresist locally;

implanting a different conductive typed dopant from the silicon layer to the uncovered region of the silicon layer so that the threshold voltage of the silicon layer is uniform on the entire surface independent of the thickness variation of the silicon layer.

4. The method of fabricating an SOI substrate as claimed in claim 3, wherein the step of applying a dopant further comprises the step of: annealing the SOI substrate after the step of implanting.

5. The method of fabricating an SOI substrate as claimed in claim 1, wherein the step of applying a dopant comprises the steps of:

covering a measured thicker region of the silicon layer than a predetermined value by a photoresist locally;

implanting a same conductive typed dopant form the silicon layer to the uncovered region of the silicon layer so that threshold voltage of the silicon layer is uniform on the entire surface independent of the thickness variation of the silicon layer.

6. The method of fabricating an SOI substrate as claimed in claim 5, wherein the step of applying a dopant further comprises the step of: annealing the SOI substrate after the step of implanting.

* * * * *